United States Patent
Brofman et al.

(10) Patent No.: US 6,283,359 B1
(45) Date of Patent: Sep. 4, 2001

(54) METHOD FOR ENHANCING FATIGUE LIFE OF BALL GRID ARRAYS

(75) Inventors: Peter J. Brofman, Hopewell Junction; Mark G. Courtney, Poughkeepsie; Shaji Farooq, Hopewell Junction; Mario J. Interrante, New Paltz; Raymond A. Jackson, Poughkeepsie; Gregory B. Martin; Sudipta K. Ray, both of Wappingers Falls; William E. Sablinski, Beacon; Kathleen A. Stalter, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/644,486

(22) Filed: Aug. 23, 2000

Related U.S. Application Data (62) Division of application No. 09/070,163, filed on Apr. 30, 1998, now Pat. No. 6,158,644.

(51) Int. Cl.$^7$ .................................................. B23K 31/02
(52) U.S. Cl. ................ 228/180.22; 228/189; 228/180.21
(58) Field of Search .............................. 228/180.22, 208, 228/180.21, 56.3, 189; 438/613–617; 257/737, 738; 361/767, 768; 428/403, 209, 643, 644, 570; 106/286.2, 287.19

(56) References Cited

U.S. PATENT DOCUMENTS

| | | | |
|---|---|---|---|
| 3,169,048 | * | 2/1965 | McGinn . |
| 4,722,471 | | 2/1988 | Gray et al. . |
| 4,788,767 | | 12/1988 | Desai et al. . |
| 5,017,738 | * | 5/1991 | Tsuji et al. . |
| 5,038,996 | * | 8/1991 | Wilcox et al. . |
| 5,062,896 | * | 11/1991 | Huang et al. . |
| 5,147,084 | | 9/1992 | Behun et al. . |
| 5,159,535 | | 10/1992 | Desai et al. . |
| 5,170,931 | | 12/1992 | Desai et al. . |
| 5,201,451 | | 4/1993 | Desai et al. . |
| 5,221,038 | * | 6/1993 | Melton et al. . |
| 5,229,070 | * | 7/1993 | Melton et al. . |
| 5,251,806 | | 10/1993 | Agarwala et al. . |
| 5,324,569 | | 6/1994 | Nagesh et al. . |
| 5,573,602 | * | 11/1996 | Banerji et al. . |
| 5,962,133 | * | 10/1999 | Yamaguchi et al. . |
| 6,013,571 | * | 1/2000 | Morrell . |
| 6,070,321 | * | 6/2000 | Brofman et al. . |
| 6,070,789 | * | 6/2000 | Conn et al. . |

FOREIGN PATENT DOCUMENTS

| | | |
|---|---|---|
| 3-095636 | 9/1991 | (JP) . |
| 410294337 | * 11/1998 | (JP) . |

* cited by examiner

*Primary Examiner*—Tom Dunn
*Assistant Examiner*—Jonathan Johnson
(74) *Attorney, Agent, or Firm*—DeLio & Peterson, LLC; John J. Tomaszewski; Ira D. Blecker (57) ABSTRACT

This invention relates to a solder structure which provides enhanced fatigue life properties when used to bond substrates particularly at the second level such as BGA and CGA interconnections. The solder structure is preferably a sphere or column and has a metal layer wettable by solder and the structure is used to make solder connections in electronic components such as joining an electronic module such as a chip connected to a MLC which module is connected to a circuit board. The solder structure preferably has an overcoat of solder on the metal layer to provide a passivation coating to the metal layer to keep it clean from oxidation and corrosion and also provide a wettable surface for attachment of the solder structure to solder on the pads of the substrate being bonded.

5 Claims, 6 Drawing Sheets

METHOD FOR ENHANCING FATIGUE LIFE OF BALL GRID ARRAYS

This is a divisional of application Ser. No. 09/070,163 filed on Apr. 30, 1998, now U.S. Pat. No. 6,158,644.

BACKGROUND OF THE INVENTION

1. Field of the Invention

This invention relates to a solder structure which provides enhanced fatigue life properties when used to bond substrates and, more particularly, to a solder structure such as a sphere or column having a metal layer which structure is used as a Ball Grid Array (BGA) or Column Grid Array (CGA) to make second level solder connections in electronic components such as joining a substrate to a circuit card.

2. Description of Related Art

The use of solder to join materials such as components of an electronic structure is well known in the art. In the electronics area there are a myriad of electronic components which require connection to other electronic components or to other levels of packaging. Examples include mounting of integrated circuit chips to a metallized substrate, multilayer ceramic substrate (MLC), laminate organic substrate, glass ceramic substrate, card (direct-chip-attach, DCA), and any substrate made of composite materials meeting thermal and mechanical properties. This description will be directed to for convenience to second level surface mount technology whereby column grid arrays (CGA) or ball grid arrays (BGA) are used to form an interconnection between a circuit board and an electronic module assembly such as a chip connected to a MLC.

The term Ball Grid Arrays (BGAs) refers to a broad class of microelectronic substrate assemblies that are connected to the board/card by means of an array of solder balls. Such interconnections are first formed by joining solder balls to the substrate assembly thus creating the BGA. The BGA is subsequently joined to the card during assembly. Substantial differences in the thermal coefficient of expansion (TCE) can exist between the board and the substrate, as is the case when the substrate is made from a ceramic material, and the board is made from an epoxy-glass composite (e.g., FR4). During thermal cycling (on-off cycles), such TCE differences cause plastic deformation of the solder ball interconnections. Accumulation of plastic strain with repeated thermal cycling ultimately leads to fatigue failure of the interconnections between the ceramic substrate and the board.

The actual fatigue life of a BGA decreases with increasing array size. Furthermore, for a given array size, the fatigue life of a BGA is a function of the materials that comprise the substrate, board, and interconnections, and also the interconnection structure. Thus, the present trend towards higher powered packages, coupled with higher I/O counts, and larger interconnection arrays, creates a need for interconnections with improved fatigue life. Using solder column arrays instead of ball arrays provides the desired improvement in fatigue life by allowing the interconnection length to increase with the enhancement in fatigue life in this case being due to the inverse relationship between interconnection length and accumulated plastic strain during thermal cycling. Unfortunately, the inherent fragility of the columns, and their sensitivity to handling damage makes them less attractive to end users. In contrast, BGAs are relatively robust, and are less sensitive to handling related damage. Thus, any approach that enhances fatigue life while maintaining the ball geometry is highly desirable, and will provide a very attractive solution to the end user.

Ceramic Column Grid Array (CCGA) packages are finding increasing use in many high performance chip carrying packages. The preferred manufacturing process for CCGA is the wire column process. This process, shown in FIG. 6A, uses eutectic Sn/Pb solder 34 to attach the column array 21 to I/O pads 26 on the ceramic carrier 25. The use of low melting eutectic solder enables the attachment of columns at the end of the module assembly, after the chip or die is attached and tested and burnt-in on the carrier. This approach has one serious drawback. The ceramic carrier is joined to an organic card 31 by using a low temperature solder, typically eutectic Sn/Pb solder 33. In card assembly operations, it is often necessary to rework the module if it is found to have a defective column joint or less frequently, to replace the chip carrier 25 with another containing a higher performing chip. During card level rework using hot gas or other localized heating techniques, both the eutectic solder interfaces 33 and 34 on the chip carrier 25 and the card 31 are molten. As a result, during removal of the chip carrier 25, a substantial number of columns can stay behind on the card as shown in FIG. 6B. Prior to rejoining of a new CCGA module, the card site has to be "dressed" which is a manual operation to remove the columns that stayed on the card I/O pads 32.

Bearing in mind the problems and deficiencies of the prior art, it is therefore an object of the present invention to provide a solder structure which provides enhanced fatigue life properties when used to bond substrates particularly electronic substrates at the second level such as a circuit board to an electronic module assembly such as a chip bonded to a multilayer ceramic substrate.

It is an additional object of the invention to provide a method of forming a higher melting column attach joint to the chip carrier I/O pad than the attach joint to a substrate such as a circuit board. The higher melting solder alloy is chosen such that it does not melt during card level module rework, thus enabling effective removal of the chip CCGA chip carrier from the card, e.g., without leaving any columns attached to the planar card I/O pads.

It is another object of the present invention to provide a method for making solder interconnections using the solder structure of the invention particularly second level ball grid array and column grid array solder interconnections.

A further object of the invention is to provide electronic structures made using the solder structures and method of the invention.

Still other objects and advantages of the invention will in part be obvious and will in part be apparent from the specification.

SUMMARY OF THE INVENTION

The above and other objects, which will be apparent to those skilled in the art, are achieved by the present invention which relates in a first aspect to a solder structure, e.g., in the form of a column or sphere, which, when used to solder bond (attach) electronic substrates together, forms an enhanced fatigue resistant solder bond, the solder structure comprising:

an inner core of solder; and a first layer of a metal wettable by the solder used for the attach and having a melting point higher than the solder of the inner core with the inner core solder preferably having a melting point higher than the solder to which the solder structure is to be attached to the substrate.

The solder structure may be a solder column up to about 87 mils tall or higher, e.g., 100 mils, and typically above about 10 mils tall. A preferred solder column has a solder height of about 50 to 87 mils. The height of the column may be over three times its diameter (the ratio of height to diameter typically being termed the aspect ratio) with high aspect ratios providing enhanced fatigue resistance. The solder structure may also be a sphere typically about 10 to 45 mil, or more, in diameter. The solder for both structures may be of any composition and preferably comprises about 3 to 20% by weight tin and the balance lead.

In another aspect of the present invention, a method is provided for making solder electrical interconnections in an electronic component assembly, particularly a second level assembly, comprising the steps of:

applying a second solder to first pads on the surface of a first substrate of the electronic component;

forming a solder structure comprising:
an inner core of a first solder; and
a first layer of a metal wettable by the solder used for the interconnection and having a melting point higher than the first solder of the inner core with the inner core solder preferably having a melting point higher than the second solder to which the solder structure is to be attached to the substrate;

bonding the solder structure to the first pads by reflowing the second solder;

applying a third solder to second pads on the surface of a second substrate of the electronic component;

positioning the pads on the surface of the second substrate of the electronic component assembly to be joined proximate to the corresponding solder structure containing pads on the first substrate;

heating the substrates to a temperature sufficient to form a bond between the solder structure and the pads on the second substrate; and cooling the bonded interconnected assembly.

In a further aspect of the invention, electronic assemblies made by the above method are also provided with the electronic assemblies comprising electronic components joined together particularly at the second level, the components also including a multilayer ceramic substrate and a semiconductor chip.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 2A–3A show, in cross-section, a method for using a spherical solder structure of the invention to bond two substrates together.

FIGS. 2B–3B show, in cross-section, a prior art method of using a spherical solder structure of the prior art to bond two substrates together.

DESCRIPTION OF THE PREFERRED EMBODIMENTS

In describing the preferred embodiment of the present invention, reference will be made herein to FIGS. 1–6B of the drawings in which like numerals refer to like features of the invention. Features of the invention are not necessarily shown to scale in the drawings.

Any suitable solder of the prior art may be used to make a solder structure of the invention. Preferably the solder is a solder commonly termed a binary solder and comprises, by weight, about 3–20% tin, typically about 5–15% tin, preferably about 10% tin, and the balance essentially lead including the usual impurities. Pure lead is preferably used. A specific alloy which is preferred because of its demonstrated effectiveness is a solder containing about 10% by weight tin and the balance essentially lead.

The solder structure of the invention may be formed using any suitable forming method. A preferred method to make spherical solder balls employs melting (casting) a pre-measured or pre-weighed amount of solder into mask cavities and cooling the mixture to form the solder in solid form. The solder structures are then removed from the mold. For a solder column, a solder wire is typically used which is cut to the desired length. The solder structures are typically exposed to an electroplating bath such as copper to form a layer of the metal on the solder.

The thickness of the metal is at least about 1 micron and typically up to about 50 microns or higher. A preferred metal thickness is about 5 to 25 microns, preferably 10 to 25 microns. The diameter of the solder of the spherical solder structure is about 10 to 45 mil, preferably 25 to 35 mil. For the solder column solder structure, the height of the solder is about 40 to 100 mil preferably 50 to 87 mil.

The metal coating may be any suitable metal which is wettable by the attach solder and is preferably Cu, Ni or Cu/Ni and may also be a metal such as Pd and Pd/Ni alloy. In a preferred embodiment, a copper layer is employed, which is overcoated with nickel and more preferably with a gold flash coating for assuring wettability. The metal thickness may vary for the first layer (copper) and the second layer (nickel) for example 10–25 micron for the copper and 1–5 micron for the nickel.

Another benefit of the invention is that the extended fatigue life of the solder joints is attained both with and without the need for module hermeticity and/or with and without an epoxy underfill. Sealing of the module and/or the use of epoxy underfill is generally used to extend the life of the component and the use of the solder structure of the invention with its enhanced fatigue life obviates the need for such techniques to increase the life of the electronic component. If such techniques are employed using the solder of the invention even more enhanced component life properties would be achieved.

Figures 1A, 1B, 5A, 5B:
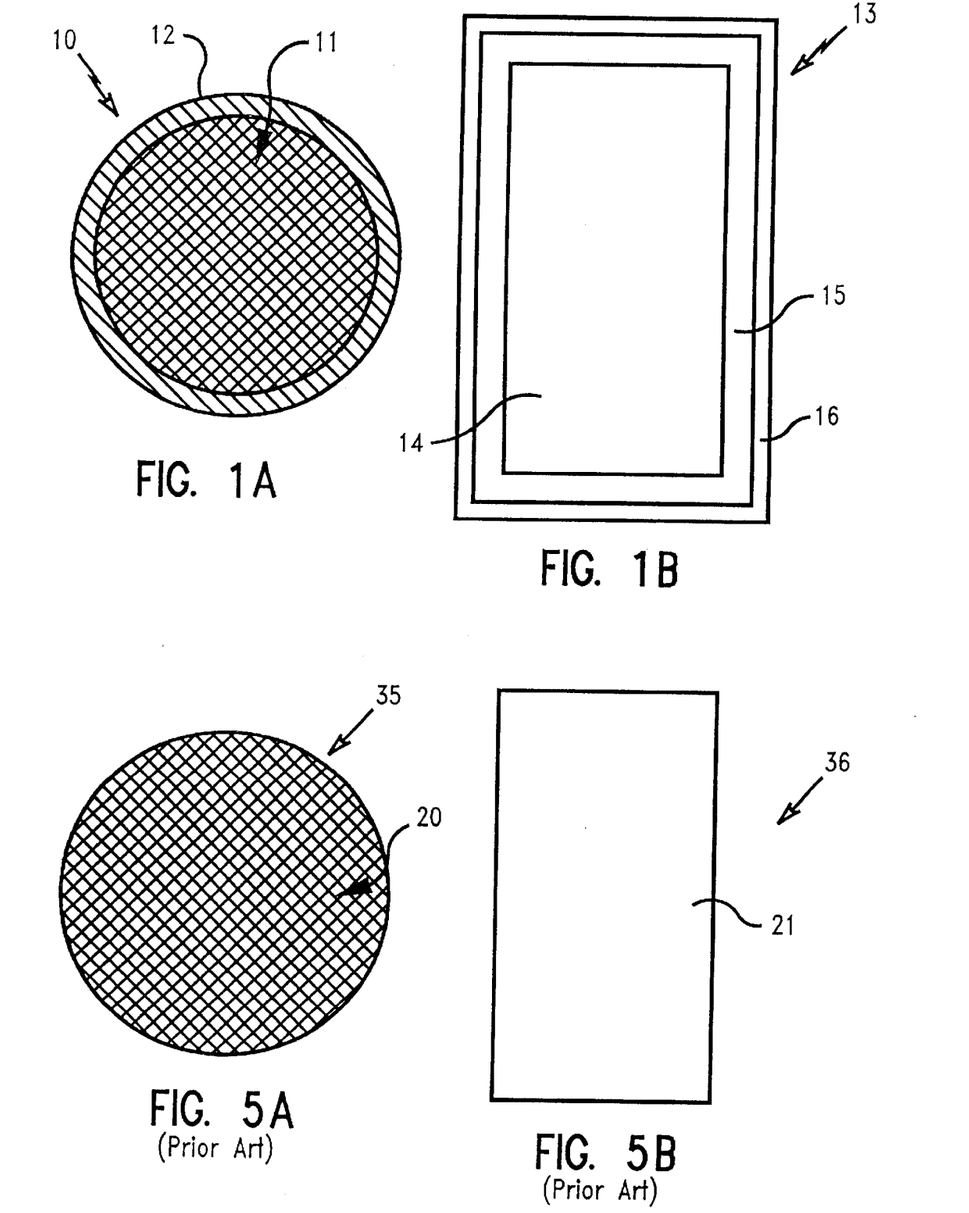
FIGS. 1A and 1B show cross-sectional views of solder structures of the invention.
FIGS. 5A–5B show cross-sectional views of solder structures of the prior art.

Referring to the figures, FIG. 1A shows generally as 10 a solder structure of the invention in a form of a sphere. The spherical solder structure 10 comprises an inner core 11 of solder and a metal layer 12. The metal layer has a melting point higher than the inner core of solder and is typically copper, nickel or Cu/Ni. As will be more fully discussed hereinbelow, it is preferred that the inner core of solder 11 have a melting point higher than the solder used to join the solder structure 10 to a substrate.

FIG. 1B shows a column solder structure of the invention generally as 13. The column solder structure 13 comprises an inner typically cylindrical solder core 14, a metal layer 15 and, in the preferred embodiment shown, an outer solder layer 16. As with the spherical solder structure 10, the solder inner core 14 has a melting point lower than the melting point of the metal layer 15. Depending on the joining application, the inner core of solder 14 typically has a melting point higher than the solder used to join solder column 13 to a substrate. The outer solder layer 16 is used to provide a passivation coating to the metal layer 15 to keep it clean from oxidation and corrosion. In addition, the solder layer 16 provides a wettable surface for attachment of the solder structure to the solder on the pads of the substrate to be connected to the column. The spherical solder structure may also employ an outer solder layer. The thickness of this solder layer may vary widely and is typically up to 2 microns or more.

FIGS. 5A and 5B show a spherical solder structure and a column solder structure of the prior art. In FIG. 5A, a spherical solder structure 35 comprises a sphere of solder 20. Likewise, column solder structure 36 of FIG. 5B comprises a column of solder 21.

Figure 2A:
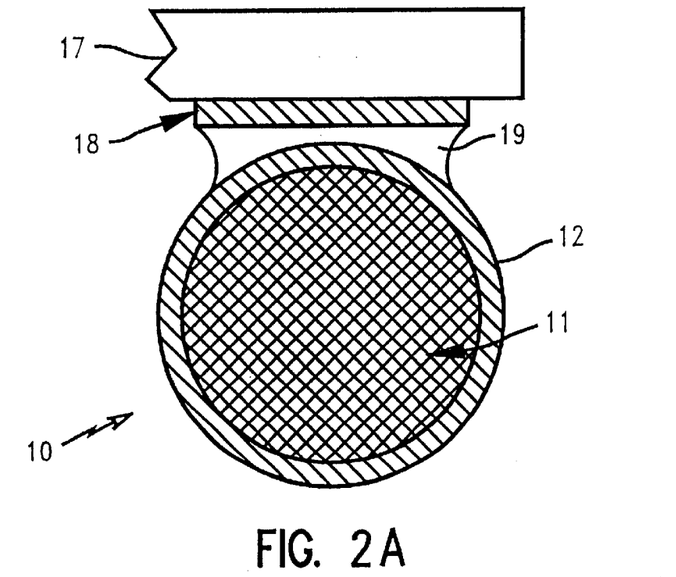

Referring to FIGS. 2A–3A a method of the invention is shown joining two substrates using a spherical solder structure of the invention. In FIG. 2A, a substrate 17 having a pad 18 is shown attached to the spherical solder structure 10 by a solder joint 19. Typically, the substrate 17 is positioned with pads 18 having solder 19 thereon and the solder structure 10 positioned on the solder 19 surface. The assembly is then reflowed joining the solder structure 10 to pad 18 with the solder 19. It is preferred that the inner solder core 11 of solder structure 10 have a melting point higher than the melting point of the solder 19 used to join the substrates to the solder structure 10. The metal layer 12 has a melting point higher than both the inner core solder 11 and joining solder 19. In some applications, the solder 11 may have a lower melting point than the solder 19 and this is possible because of the mass of the solder ball 10 wherein in the length of time for reflow, the inner core of solder will not be significantly melted deforming the solder structure 10.

Figure 3A:
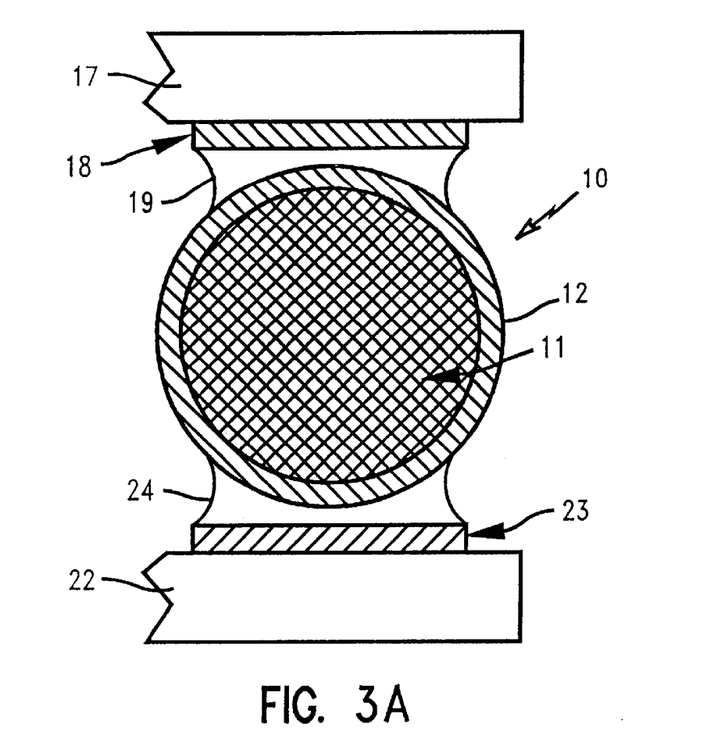

FIG. 3A shows the solder structure 10 containing substrate 17 being joined to substrate 22. Substrate 22 has a pad 23 which is joined to solder structure 10 by solder joint 24. Again, solder joint 24 will typically be a lower melting point solder than the solder 11 of solder structure 10.

Figure 2B:
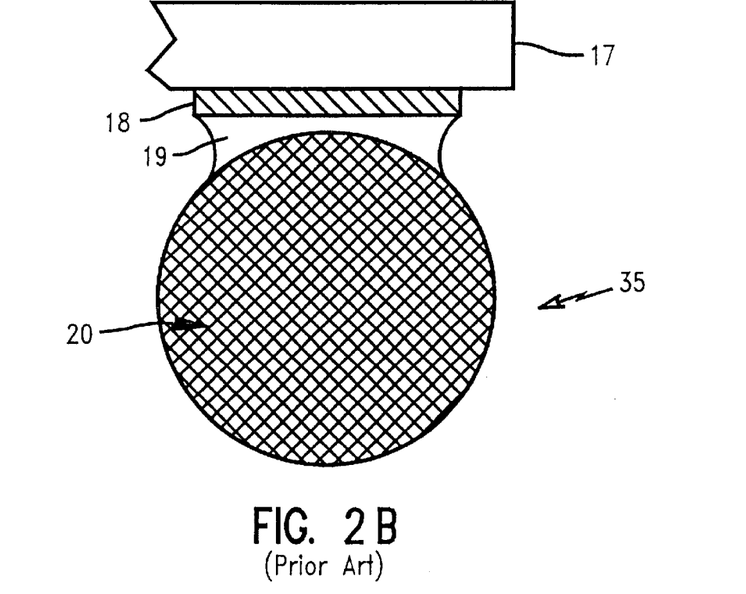
Figure 3B:
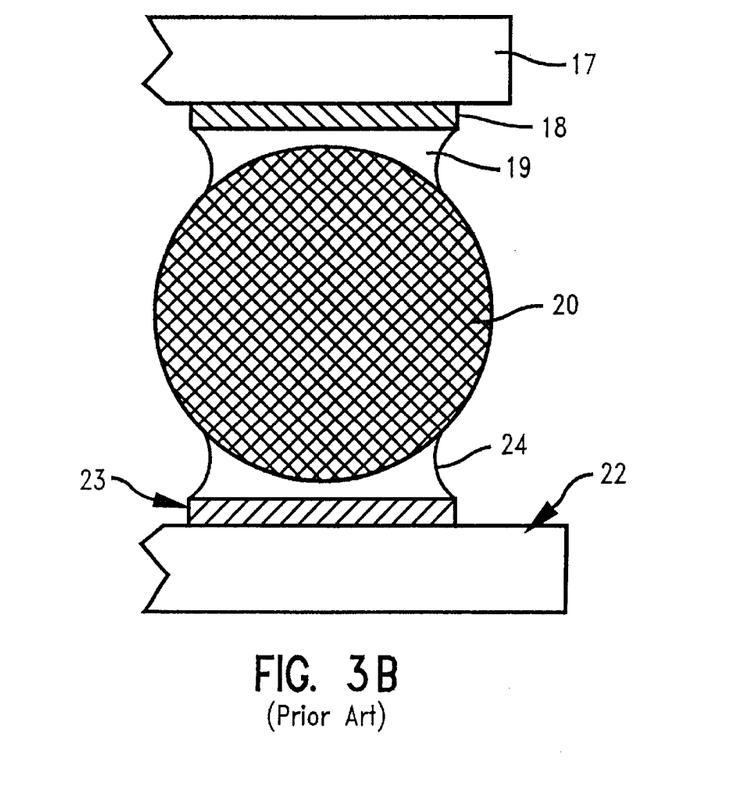

Referring to FIGS. 2B and 3B which show the prior art method of joining two substrates using a solder ball without a metallic coating is shown. Thus, substrate 17 having a pad 18 is joined to solder structure 35 comprising a ball of solder 20 by a solder joint 19. The solder structure 35 would be joined to the pad 18 by the same reflow method described hereinabove for FIG. 2A. The structure assembly is then joined to substrate 22 having a pad 23 by solder 24 as shown in FIG. 3B.

Comparing the solder joint of FIG. 3A and the prior art solder joint of FIG. 3B, it is hypothesized that the presence of a metallic shell 12 on the solder ball structure 10 stiffens the ball allowing the strains generated during thermal cycling to be distributed more uniformly throughout the ball and the joints. Furthermore, the use of a relatively stiff metal overcoating places the soft core solder under a triaxial constraint, minimizing local deformation. This, in turn, minimizes macroscopic changes in the shape of the solder ball 10 with the solder ball of FIG. 3A maintaining its shape whereas the solder ball 35 of FIG. 3B of the prior art may be deformed during reflow. Shape change is a factor that is known to accelerate fatigue damage in C-4 systems.

Additionally, the metal layer acts as a diffusion barrier between the lead present in the solder within the metal shell and the lead-tin solder used to form the joint. Consequently, the composition of the solder joints at both substrate interfaces remain close to the original solder composition. In the absence of such a barrier, the joint may become lead rich during joining due to interaction between the joint solder alloy and the solder ball. The microstructure of the solder joint in the absence of a barrier, may then be characterized by large proeutectic dendrites of the lead-rich phase surrounded by the eutectic phase mixture of the joint solder. In contrast, the presence of a barrier layer gives rise to a eutectic microstructure with a negligible amount of proeutectic lead-rich phase. It is hypothesized that the latter structure is more resistance to crack propagation and hence, has a higher fatigue resistance.

Referring to FIGS. 4A–4F, a method of the invention is shown using a column structure of the invention to join two substrates using two different joining solders to facilitate rework of the joined assembly. The description below is applicable also to the use of a spherical solder ball.

Figure 4A:
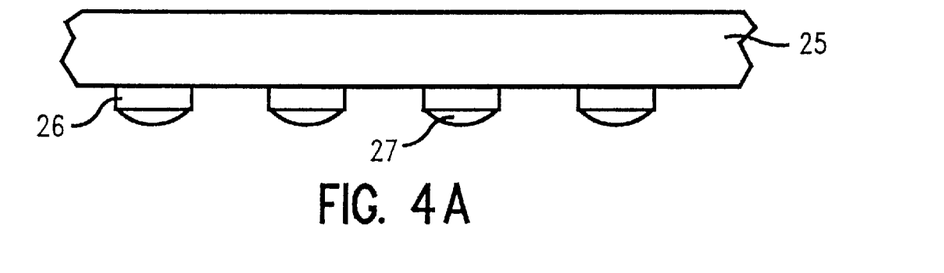
FIGS. 4A–4F show, in cross-section, a method using a column solder structure of the invention to bond two substrates together and rework of the substrates.
Figure 4B:
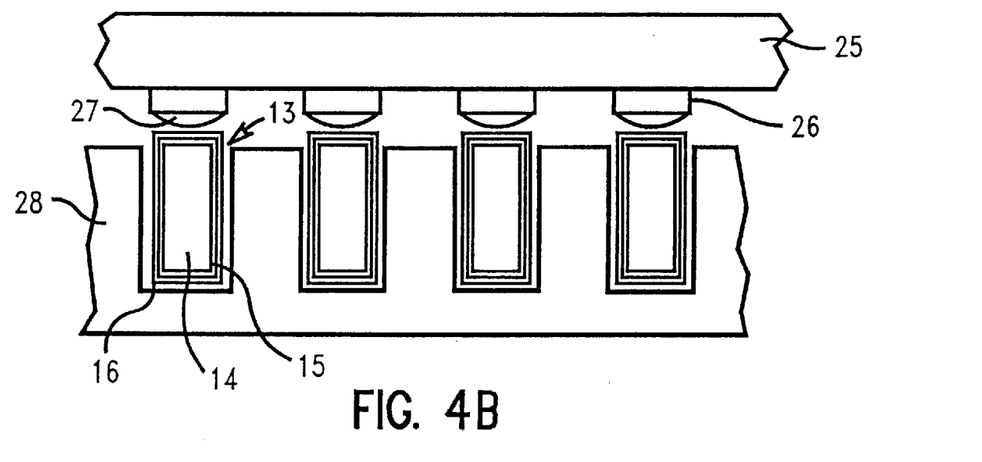
Figure 4C:
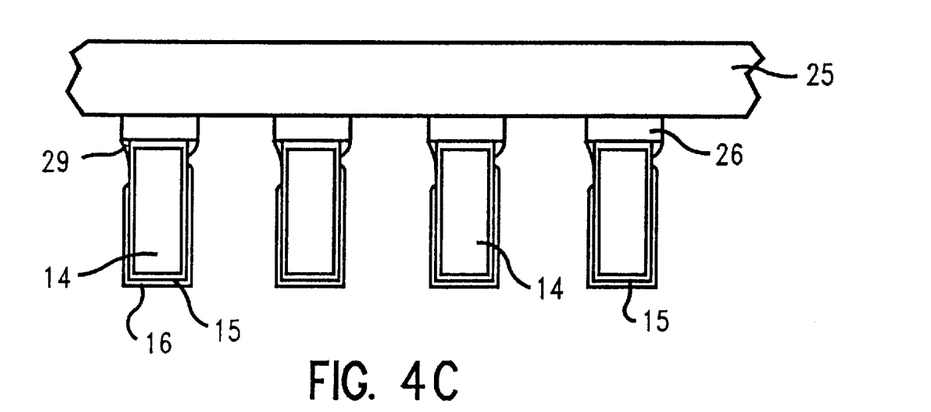

FIG. 4A, the substrate 25 is shown having a pad 26 and a high melting point solder 27 deposited on the pad. The solder is deposited on the pads by known techniques. In FIG. 4B, a graphite mold 28 having solder columns 13 disposed in openings in the mold is positioned relative to the pads 26 on substrate 25. The assembly is then reflowed forming the assembly shown in FIG. 4C wherein the solder columns 13 are attached to pads 26 by high temperature solder joint 29. A preferred embodiment is shown in these figures wherein the solder column 13 comprises an inner solder core 14, a metal layer 15 and an outer solder layer 16. The purpose of the solder layer 16 is to provide a passivation coating to the barrier layer 15 to keep it clean from oxidation and corrosion. In addition, the solder layer 16 provides a wetable surface for attachment of column 13 to substrate 25 with the high temperature solder 27. Upon reflow, the high temperature solder 27 melts and the outer layer of solder 16 melts forming a metallurgical bond with the metal layer 15 of solder column 13. Accordingly, the formed solder joint will comprise a mixture of high temperature solder 27 and solder 16 forming a solder joint shown as 29.

Figure 4D:
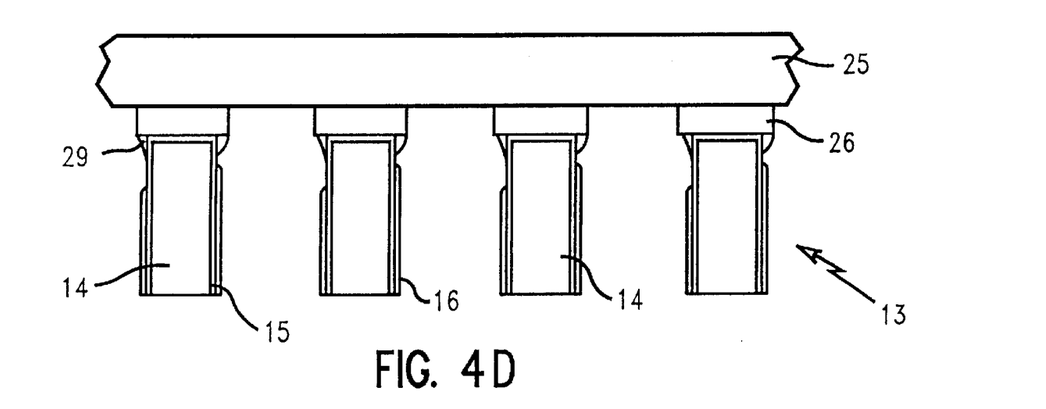
Figure 4E:
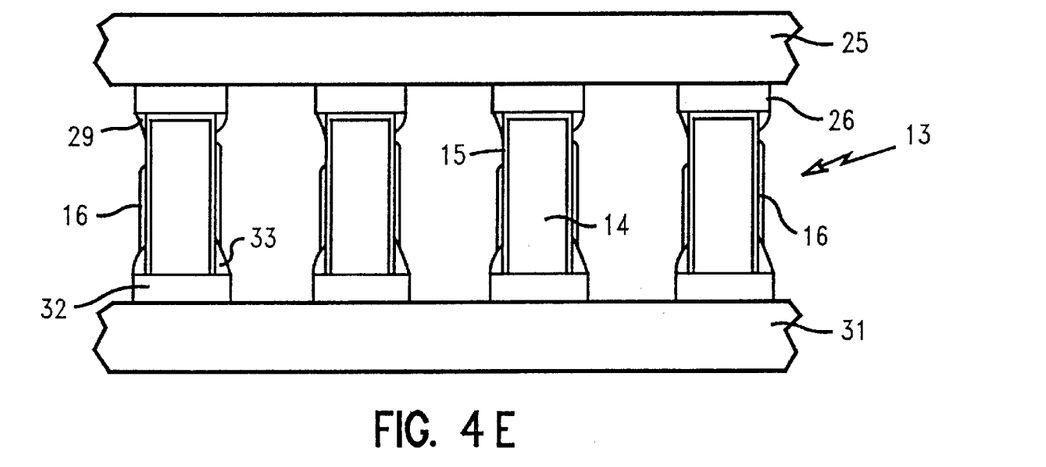

At this stage, the substrate 25 having a solder columns 13 attached thereto is ready for joining to another substrate. In some applications it is preferred that the ends of the columns be shaved to assure a column height with a very tight tolerance. In such an operation, the solder layer 16 and metal layer 15 will be removed thus exposing the solder 14 inner core. This is shown in FIG. 4D. Since the substrate 25 with the attached column grid array joined is attached to a second substrate using typically a eutectic solder, the exposed solder core of the column does not change the composition of the eutectic solder on the card side joints. The integrity of the chip carrier 25 side interface is maintained with the coated column array 13. FIG. 4E shows the substrate 25 joined to substrate 31 by column 13 which now comprises inner solder core 14, metal layer 15 and some partial outer solder layer 16. Substrate 31 has pads 32 and is joined to the solder column 13 by solder joint 33. Solder joint 33, is as noted above, may contain some lead due to the shaving operation and/or melting of the outer layer 16 of the solder column 13 but will still have a lower melting point than the solder joint 29.

Figure 4F:
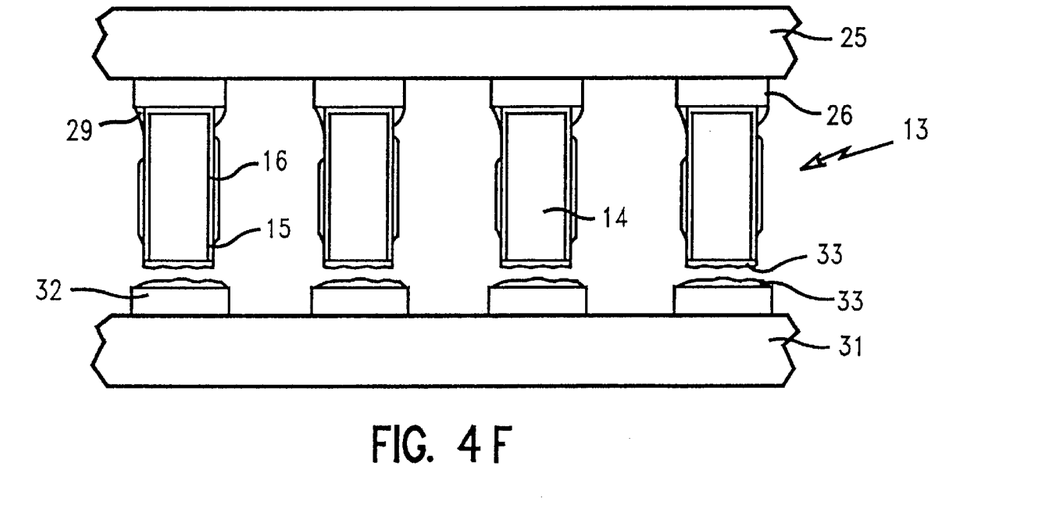

Referring to FIG. 4F, the assembly of FIG. 4E is shown after rework. Thus, the assembly would be heated and substrate 25 removed from substrate 31 for replacement typically of substrate 25. As can be seen, all the solder columns 13 are removed after reflow and separation of substrate 25 from 31. This allows removal of the substrate 25 without any substantial number of columns being left on the card (substrate 31) as discussed hereinbelow in FIG. 6B.

Figure 6A:
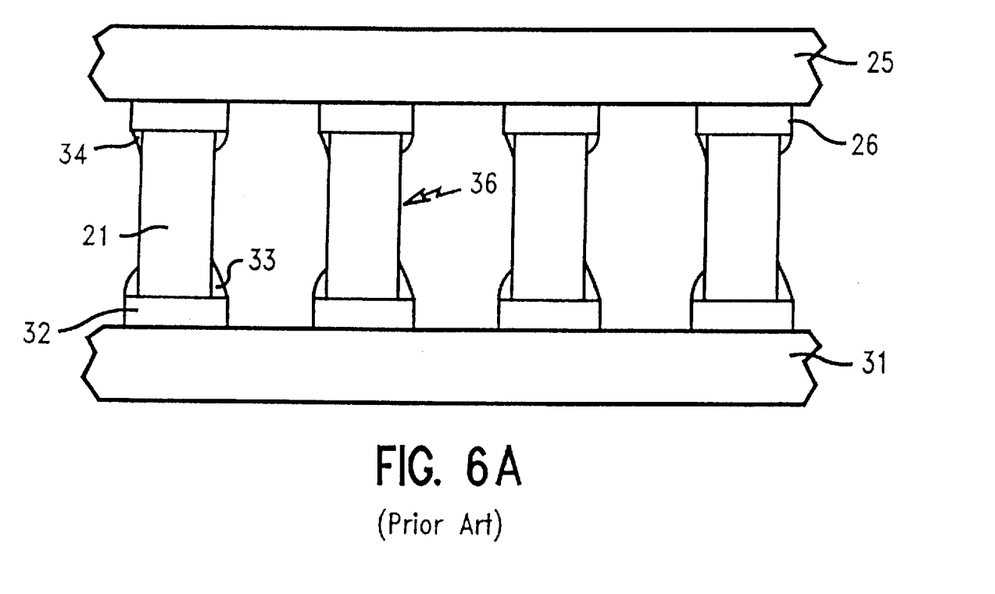
FIGS. 6A–6B show, in cross-section, two substrates bonded together using a solder column of the prior art and reworking of the bonded substrates.
Figure 6B:
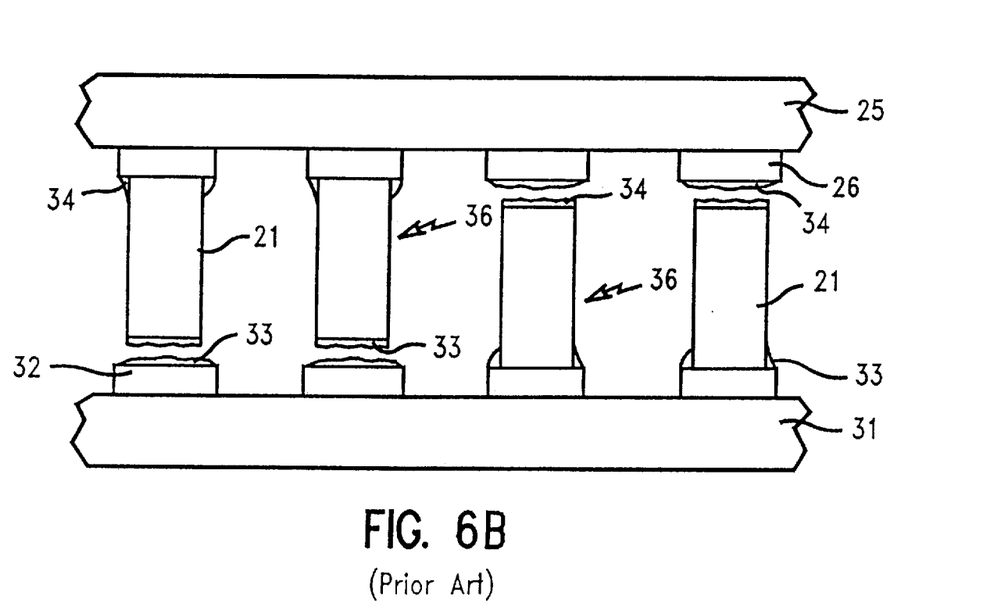

FIGS. 6A and 6B show a prior art joining of two substrates using a column solder structure 36. Thus, in FIG. 6A, a substrate 25 is joined to a substrate by solder columns 36. Pads 26 are joined to solder 21 of solder column 36 by solder joint 34 and pads 32 joined to solder 21 of solder column 36 by solder joint 33. During rework, separation of substrate 25 from substrate 31 results in some solder columns 36 still being attached to substrate 25 and some columns still being attached to substrate 31 as shown in FIG. 6B. The ability to remove a column grid array package from a card without leaving any columns on the card side as shown in FIG. 6B reduces rework costs and improves card assembly throughput.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for making solder electrical interconnections in an electronic component assembly comprising the steps of:

applying a first solder having a first melting point to first pads on the surface of a first substrate of an electronic component assembly;

forming a solder structure comprising:

an inner core of a second solder having a second melting point which is higher than the melting point of the first solder to which the structure is to be bonded;

a layer of a metal wettable by the first solder and having a melting point higher than the second melting point of the second solder of the inner core;

an outer layer of a third solder having a third melting point which provides a wettable surface for attachment of the solder structure and passivates the layer of metal from oxidation and corrosion, the third melting point being lower than the second melting point;

bonding the solder structure to the first pad by reflowing the first and third solders;

applying a fourth solder to second pads on the surface of a second substrate of the electronic component assembly;

positioning the second pads on the surface of the second substrate electronic component assembly to be joined proximate to the corresponding solder structure containing pads on the first substrate;

heating the substrates to a temperature sufficient to form a bond between the solder structure and the pads of the second substrate; and cooling the bonded interconnected assembly.

2. The method of claim 1 wherein the structure is in the form of a sphere.

3. The method of claim 1 wherein the structure is in the form of a column.

4. The method of claim 1 wherein the metal layer is copper or nickel.

5. The method of claim 1 wherein the free end of the solder structure is shaved to expose the inner core of solder and to provide a desired height of the solder structure which shaved end of the structure is then bonded to the pads on the second substrate.

* * * * *